(12) United States Patent
Park et al.

(10) Patent No.: US 8,198,609 B2
(45) Date of Patent: Jun. 12, 2012

(54) APPARATUS FOR FORMING NANO PATTERN AND METHOD FOR FORMING THE NANO PATTERN USING THE SAME

(75) Inventors: Moo Youn Park, Gwangmyeong-si (KR); Jin Ha Kim, Seongnam-si (KR); Soo Ryong Hwang, Gunpo-si (KR); Il Hyung Jung, Seoul (KR); Jong Ho Lee, Seoul (KR)

(73) Assignee: Samsung LED Co., Ltd, Suwon (KR)

( * ) Notice: Subject to any disclaimer, the term of this patent is extended or adjusted under 35 U.S.C. 154(b) by 320 days.

(21) Appl. No.: 12/219,547

(22) Filed: Jul. 23, 2008

(65) Prior Publication Data

US 2009/0039293 A1 Feb. 12, 2009

(30) Foreign Application Priority Data

Aug. 9, 2007 (KR) ........................ 10-2007-0080268

(51) Int. Cl.
*G21G 1/00* (2006.01)
(52) U.S. Cl. ............. 250/492.2; 250/492.1; 250/492.22; 355/67; 355/71
(58) Field of Classification Search ............... 250/492.1, 250/492.2, 492.22; 355/67, 71; 430/1, 2, 430/269; 359/1, 35
See application file for complete search history.

(56) References Cited

U.S. PATENT DOCUMENTS

| 7,088,482 | B2* | 8/2006 | Edwards | 359/11 |
| 2001/0021010 | A1* | 9/2001 | Suzuki | 355/67 |
| 2001/0035991 | A1 | 11/2001 | Hobbs et al. | |
| 2005/0094152 | A1* | 5/2005 | Allen | 356/491 |
| 2005/0117187 | A1* | 6/2005 | Chen et al. | 359/35 |
| 2005/0147921 | A1 | 7/2005 | Lin et al. | |
| 2006/0170896 | A1* | 8/2006 | Markoya et al. | 355/67 |
| 2006/0270206 | A1* | 11/2006 | Cho et al. | 438/597 |
| 2007/0077498 | A1* | 4/2007 | Yumoto et al. | 430/1 |
| 2008/0241706 | A1* | 10/2008 | Li et al. | 430/2 |

FOREIGN PATENT DOCUMENTS

| EP | 1 801 655 A2 | 6/2007 |
| JP | 59-083111 | 5/1984 |
| JP | 06-300909 | 10/1994 |
| JP | 09-153446 | 6/1997 |
| JP | 2002-022949 | 1/2002 |
| JP | 2004-294756 | 10/2004 |
| JP | 2005-099537 | 4/2005 |
| JP | 2006-093644 | 4/2006 |
| JP | 2006-210923 | 8/2006 |
| JP | 2006-259519 | 9/2006 |
| JP | 2007-194607 | 8/2007 |
| KR | 1020030082618 | 10/2003 |
| WO | 2005/094152 | 10/2005 |

OTHER PUBLICATIONS

Korean Office Action (Notice of Allowance) issued on Jan. 8, 2009 in corresponding Korean Patent Application.

(Continued)

*Primary Examiner* — Michael Maskell

(57) ABSTRACT

The present invention relates to an apparatus for forming a nano pattern capable of fabricating the uniform nano pattern at a low cost including a laser for generating a beam; a beam splitter for splitting the beam from the laser into two beams with the same intensity; variable mirrors for reflecting the two beams split by the beam splitter to a substrate; beam expansion units for expanding diameters of the beams by being positioned on paths of the two beams traveling toward the substrate; and a beam blocking unit, installed on an upper part of the substrate, transmitting only a specific region expanded through the beam expansion unit and blocking regions a remaining region, and a method for forming the nano pattern using the same.

5 Claims, 3 Drawing Sheets

OTHER PUBLICATIONS

European Search Report dated Dec. 7, 2010 in corresponding European Patent Application 08012920.8.
Japanese Office Action dated Jan. 25, 2011 issued in corresponding Japanese Patent Application No. 2008-204695.
Japanese Office Action dated Jun. 14, 2011, issued in Japanese Patent Application No. 2008-204695.
European Office Action dated Aug. 12, 2011, issued in corresponding European Patent Application No. 0802920.8.
Japanese Decision to Decline Amendment and Decision of Rejection mailed Nov. 22, 2011 issued in corresponding Japanese Patent Application No. 2008-204695.

* cited by examiner

[FIG. 1]
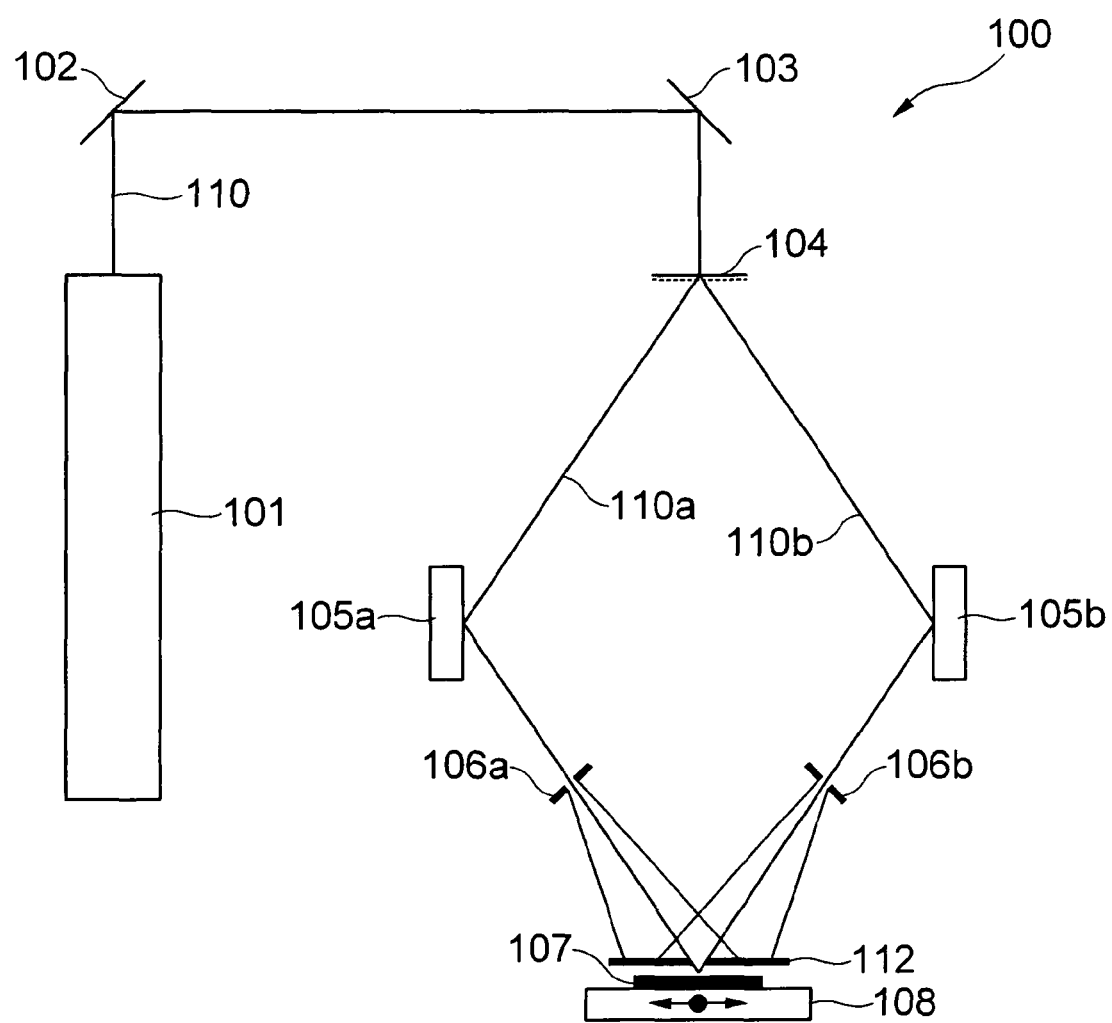

[FIG. 2]
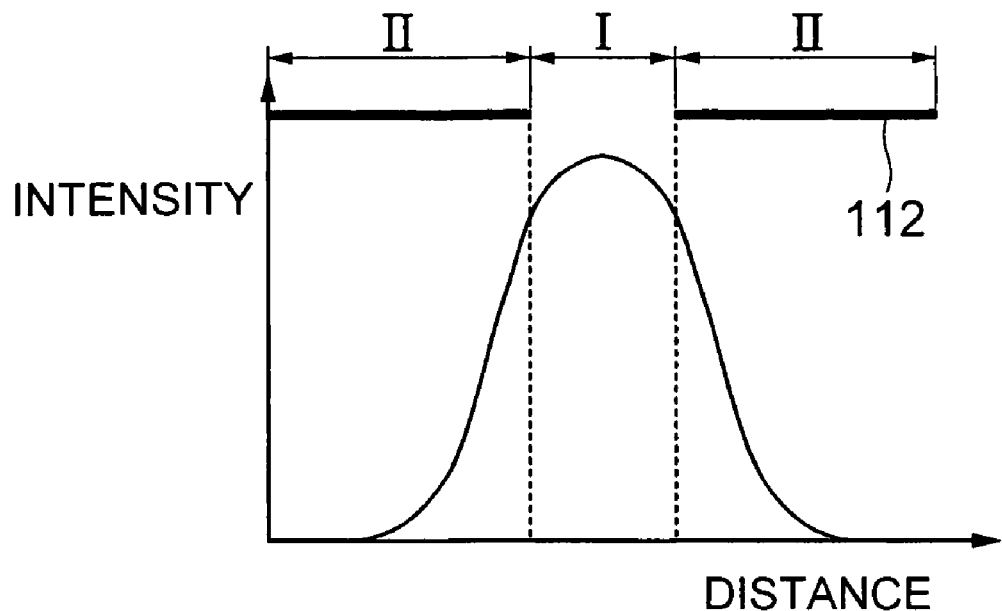
[FIG. 3]
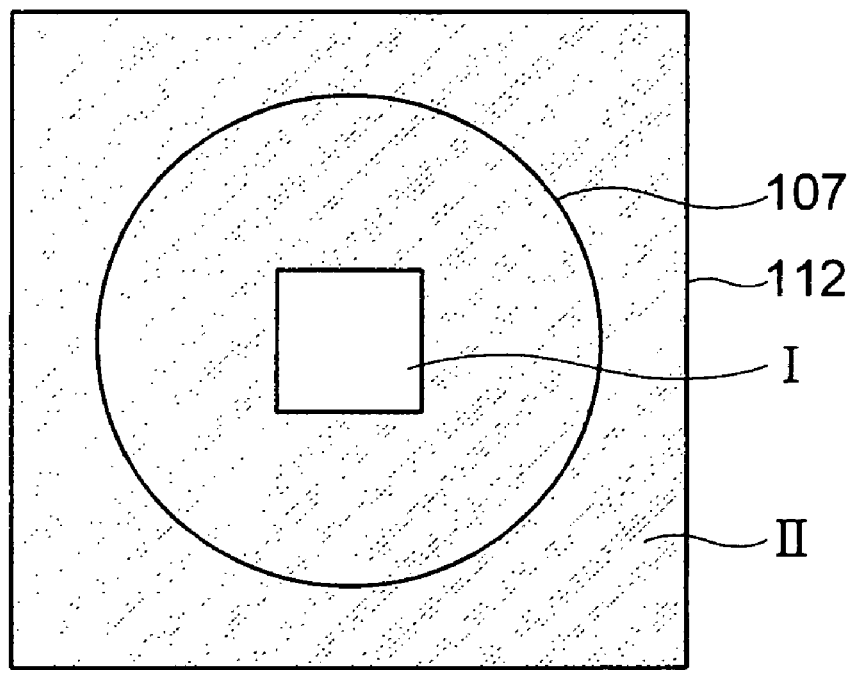

[FIG. 4]
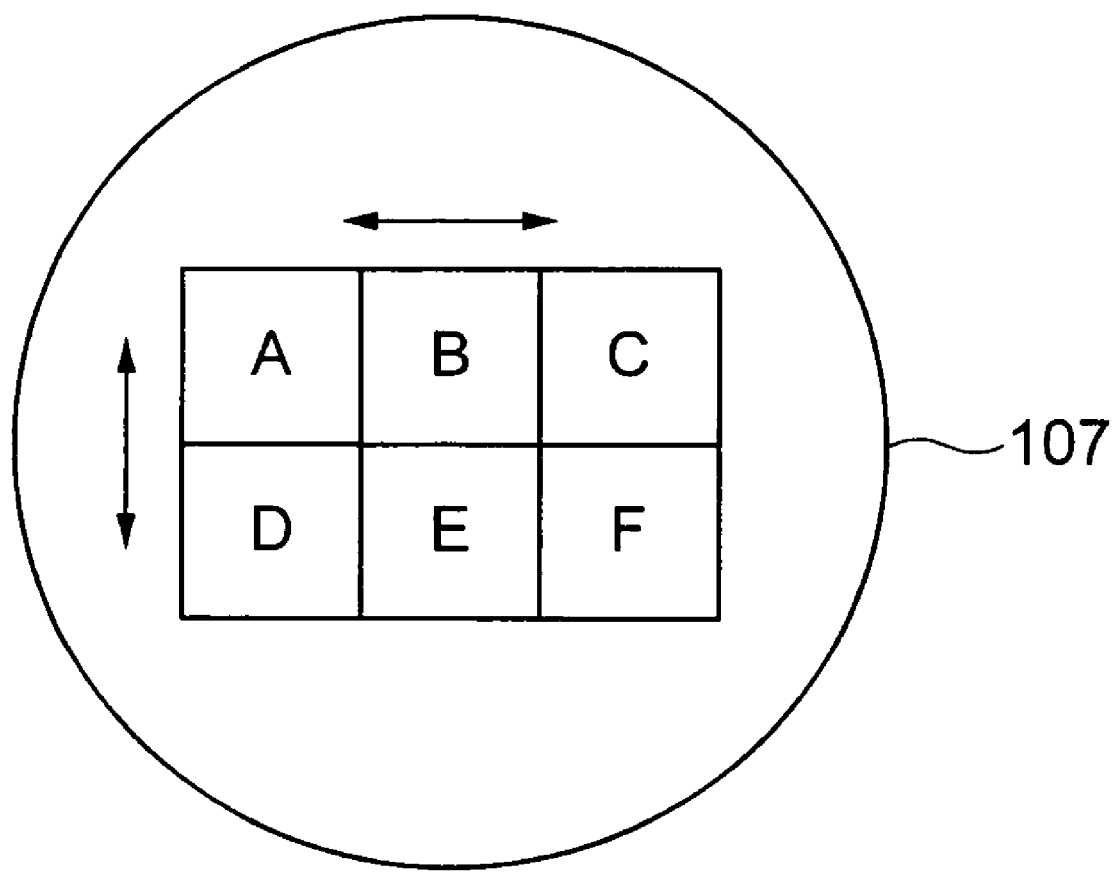

APPARATUS FOR FORMING NANO PATTERN AND METHOD FOR FORMING THE NANO PATTERN USING THE SAME

CROSS-REFERENCE TO RELATED APPLICATIONS

This application claims the benefit of Korean Patent Application No. 10-2007-0080268 filed with the Korea Intellectual Property Office on Aug. 9, 2007, the disclosure of which is incorporated herein by reference.

BACKGROUND OF THE INVENTION

1. Field of the Invention

The present invention relates to an apparatus for forming a nano pattern; and, more particularly, to an apparatus for forming a nano pattern uniformly at a low cost and a method for forming the nano pattern using the same.

2. Description of the Related Art

Generally, a nano-patterning technique has been widely used in a semiconductor field such as circuit design, and so on, as a technique for forming a fine structure shape below 100 nm on a desired substrate.

In the nano-patterning technique, because patterns to be formed are very fine in comparison with the substrate on which the patterns are formed, a method for uniformly fabricating patterns with a desired shape on the wide substrate is becoming a key issue.

The nano-patterning technique is mainly divided into a nano imprinting method and a holographic lithography according to a principle of forming the patterns.

The nano imprinting method is a method of transferring a previously formed master shape to a substrate by using a mechanical principle similarly to a method of imprinting a stamp, wherein a pattern is formed by coating UV curable resin on a substrate, imprinting a master with a pattern thereon and curing the resin through UV rays. Therefore, the nano printing method has an advantage of obtaining the uniform shape on a region with the same size as the master only if the desired shape is formed on the master according to the principle of transferring the shape of the master to the substrate, and thus it is appropriate for mass-production of the same shape.

However, if a desired pattern is changed, the master should be newly fabricated to match with the changed pattern and further a fabrication cost of the master is very high, thereby deteriorating flexibility. Further, because the master should be periodically washed according to a characteristic of a process, the master should be replaced after producing a predetermined number of patterns, and equipment for nano imprinting is also very high, a process cost is greatly increased.

The holographic lithography is a method of transferring an interference pattern generated due to interference of a laser beam to a substrate by using an optical principle. This method has an advantage of improving flexibility by easily changing a period of the desired pattern through the controlling of an angle of a coherent beam without requiring the mask for forming the pattern. However, this method is not suitable for forming the uniform patterns over a wide area since a size of the beam is less than 1 mm according to a characteristic of a laser and a region on which the pattern is fabricated is very narrow. Hence, for fabricating the pattern over the wide area through the holographic lithography, two methods, i.e., a beam expansion method and a beam scanning method, are currently used.

The beam expansion method, one of the most widely used methods, is a method of producing a pattern by expanding a small laser beam to a predetermined size by using a lens and has an advantage of widening an area on which the pattern is produced by adding an optical unit for beam expansion in a general holographic lithography system. However, since this method merely expands the laser beam, it has a drawback that uniformity of the pattern is deteriorated as the pattern becomes more distant from a center of the beam according to a characteristic of the laser beam with Gaussian beam intensity distribution.

That is, while the beams pass through the beam expansion unit, diameters of the beams are increased so that the beams meet on a substrate to form an interference pattern, wherein the uniformity of the formed interference pattern tends to be reduced as the interference pattern gets away from a central part of the substrate according to the characteristic of the laser beam, and thus the pattern is hardly impressed on a position apart from the central part at a predetermined distance. Accordingly, to obtain the uniformity over a wide range, the beam should be expanded, but the intensity of the beam is reduced and an exposure time is extended, whereby the contrast of the interference pattern is deteriorated according to a characteristic of an interferometer which is sensitive to vibration and disturbance to prevent the pattern from being formed.

The beam scanning method is a method of fabricating a pattern over a wide area by scanning the entire surface of a substrate with a small laser beam and has an advantage of fabricating a very uniform pattern over the wide area, meanwhile, because many hours are required to perform the scanning over the wide area and a precise stage and a feedback system for scanning are needed to maintain an interference pattern during scanning, the beam scanning method is not economical.

That is, in case of the beam scan type, because a beam generated from the laser is directly used without installing an additional beam expansion unit, the formed pattern is very small and therefore in order to form the pattern on the entire surface of the substrate, the substrate is put on a stage for precisely controlling the substrate and scanned with the laser beam. Accordingly, the beam scan type has an advantage of forming the very uniform patterns on the entire surface of the substrate, but it has disadvantages of needing the very high cost precise stage and feedback control system for beam scanning and increasing a time of fabricating the pattern.

SUMMARY OF THE INVENTION

The present invention has been invented in order to overcome the above-described problems and it is, therefore, an object of the present invention to provide an apparatus for forming a nano pattern and a method for forming the nano pattern using the same capable of fabricating a fine pattern with piecewise uniformity over a wide area at a low cost in a short time by combining advantages of the beam expansion method and the beam scanning method.

The object of the present invention can be achieved by providing an apparatus for forming a nano pattern including a laser for generating a beam; a beam splitter for splitting the beam from the laser into two beams with the same intensity; variable mirrors for reflecting the two beams split by the beam splitter to a substrate; beam expansion units for expanding diameters of the beams by being positioned on paths of the two beams traveling toward the substrate; and a beam blocking unit, installed on an upper part of the substrate, transmitting only a specific region expanded through the beam expansion unit and blocking a remaining region.

And, the apparatus for forming the nano pattern may further include a substrate transfer device for transferring the substrate vertically and horizontally by being provided on a lower part of the substrate and the beams can be uniformly irradiated over the entire surface of the substrate through the substrate transfer device.

Further, the apparatus for forming the nano pattern may further include reflection mirrors for changing the paths of the beams generated from the laser between the laser and the beam splitter and the paths of the beams can be variously changed by controlling the number of the reflection mirrors.

The beam blocking unit is constructed to transmit only a central region of the expanded beams and block a remaining region beyond the central region, that is, the regions where the intensity of the beams is remarkably reduced.

Further, the object of the present invention can be achieved by providing a method for forming a nano pattern including the steps of: generating a beam through a laser; splitting the beam into two beams with the same intensity through a beam splitter; directing the two beams to a substrate through variable mirrors; expanding diameters of the beams through beam expansion units respectively positioned on paths of the beams traveling toward the substrate; and illuminating the substrate by transmitting a central region of the expanded beams through a beam blocking unit provided on an upper part of the substrate.

At this time, the substrate is coated with UV curable resin and the region where the beams are irradiated may remain in a developing solution or be removed according to the kind of the UV curable resin.

And, the method may further includes a step of: changing the path of the beam generated from the laser through at least one reflection mirror and the path of the beam may be variously changed according to the number of the reflection mirrors.

Further, the uniform beams are irradiated over the entire surface of the substrate by movement of a substrate transfer device on which the substrate is mounted and the substrate transfer device is capable of being moved vertically and horizontally.

As described above, the apparatus for forming the nano pattern in accordance with the present invention is capable of forming the uniform pattern over the entire surface of the substrate in comparison with the conventional beam expansion method by transmitting only the central region of the expanded beams through the beam expansion unit, that is, only the beams of the region except the regions where the intensity of the beams is remarkably reduced, through the beam blocking unit installed on the upper part of the substrate.

That is, the conventional beam expansion method has the disadvantage that the pattern is hardly formed on the position apart from the central part at the predetermined distance since the expanded beams through the beam expansion unit shows the Gaussian distribution that the intensity of the expanded beams is sharply reduced as the expanded beams gets away from the central part and all the beams contribute to forming the pattern. Meanwhile, in accordance with the present invention, it is possible to improve uniformity of the pattern formed in the region where beams are transmitted by increasing uniformity of the intensity of the beams contributing to the beam formation by blocking regions where the intensity of the beams is remarkably reduced and transmitting only the central region through the beam blocking unit and further to form the uniform fine pattern over the entire surface of the substrate by forming the pattern on a new part of the substrate on which the pattern is not formed through the movement of the substrate transfer device by the same method.

Further, in accordance with the present invention, the method for forming the fine pattern has advantages of reducing a fabricating time of the pattern by using the expanded beams through the beam expansion unit and of reducing a cost without requiring the high cost precise stage and feedback control system in comparison with the conventional beam scanning method.

That is, in the conventional beam scanning method, because the beam from the laser is directly used, the pattern formed on the substrate is very small and therefore in order to form the pattern on the entire surface of the substrate, the substrate is put on the precise stage for precisely transferring the substrate and scanned with the laser beam. Therefore, the beam scanning method has the disadvantages of needing the high cost precise stage and feedback control system for beam scanning and increasing the time of fabricating the pattern.

Meanwhile, in accordance with the present invention, it is possible to increase the size of the pattern formed on the substrate by using the beam expansion unit and the beam blocking unit for transmitting the predetermined region of the expanded beams, to reduce the time of fabricating the pattern by forming the pattern over the entire surface of the substrate by transferring the substrate as much as the transmission region of the beams vertically and horizontally and to reduce the cost without requiring the high cost precise stage and feedback control system substrate in comparison with the beam scanning method.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a schematic view showing a construction of an apparatus for forming a nano pattern in accordance with the present invention;

FIG. 2 is a view showing intensity distribution of a beam expanded through a beam expansion unit and regions selectively transmitted and blocked through a beam blocking unit in the intensity distribution of the beam;

FIG. 3 is a view showing a region contributing to forming the pattern on a substrate through the beam blocking unit; and FIG. 4 is a view showing sections on which the patterns are sequentially formed by transferring the substrate.

DETAILED DESCRIPTION OF THE PREFERRED EMBODIMENTS

Hereinafter, an apparatus for forming a nano pattern and a method for forming the nano pattern using the same in accordance with the present invention will be described in detail with reference to the accompanying drawings.

FIG. 1 is a schematic view showing a construction of an apparatus for forming a nano pattern in accordance with the present invention.

As shown in FIG. 1, in accordance with the present invention, the apparatus for forming the nano pattern 100 includes a laser 101 for generating a beam 110, a beam splitter 104 for splitting the beam 110 into two beams 110$a$ and 110$b$; variable mirrors 105$a$ and 105$b$ directing the two split beams 110$a$ and 110$b$ to a substrate 107; beam expansion units 106$a$ and 106$b$ for diffusing the beams by being positioned on paths of the beams traveling toward the substrate 107; and a beam blocking unit 112 for transmitting only a specific region of the beams expanded through the beam expansion units 106a and 106b.

The apparatus for forming the nano pattern 100 may further include at least one mirror 102 and 103 for changing a path of the beam 110 generated from the laser 101 between the laser 101 and the beam splitter 104 and the path of the beam may be freely controlled by varying the number of the reflection mirrors 102 and 103. In accordance with one embodiment of the present invention, the path of the beam is changed twice through the two reflection mirrors 102 and 103.

The beam splitter 104 splits the beam 110 received through the reflection mirrors 102 and 103 into two beams 110a and 110b with the same intensity to send the beams 110a and 110b toward the two variable mirrors 105a and 105b facing each other and the beams 110a and 110b which reach the variable mirrors 105a and 105b are reflected respectively to travel toward the substrate 107 mounted on a substrate transfer device 108.

Diameters of the beams 110a and 110b reflected through the two variable mirrors 105a and 105b are expanded by passing each of the beams 110a and 110b through the beam expansion unit 106a and 106b which are positioned on paths of the beams 110a and 110b traveling toward the substrate 107 and the expanded beams meet the substrate 107 to form an interference pattern.

At this time, UV curable resin(not shown) is coated on the substrate 107 and the interference pattern is formed on the UV curable resin.

And, all the expanded beams are not irradiated on the substrate 107 and only a part of the expanded beams which are transmitted through the beam blocking unit 112 provided on an upper part of the substrate 107 are irradiated on the substrate 107.

That is, the beam blocking unit 112, as shown in FIG. 2, includes a transmission unit I for transmitting the beams and a blocking unit II for blocking the beams and right before the expanded beams through the beam expansion units 106a and 106b are irradiated on the substrate 107, only a central part of the expanded beams is transmitted by the beam blocking unit 112 and irradiated on the substrate 107 to form the interference pattern.

At this time, because the expanded beams through the beam expansion units 106a and 106b are gathered toward the substrate 107, the beams shows a Gaussian distribution that the beams have the maximum intensity at the central part where the beams are overlapped and the intensity of the beams is sharply reduced as getting away from the central part.

And, the beam blocking unit 112 blocks the beams on the regions where the intensity of the beams is remarkably reduced through the blocking unit 11 and transmits the beams on the region where the intensity thereof is almost uniformly distributed, that is, the central part through the transmission unit I.

Therefore, because the beams contributing to forming the pattern on the substrate 107 have the uniform intensity in comparison with the conventional beam expansion method, the uniformity of the pattern formed within the transmission unit I region is improved. At this time, the transmission unit I region is not limited to the predetermined intensity of the beam but it is preferable to limit the transmission unit I region to a point at which the intensity of the beams is a half of the maximum. However, it is allowable to limit the region to a point at which the intensity of the beams is smaller than the half of the maximum.

FIG. 3 is a plane-view showing the beam blocking unit 112 and as shown, the pattern is formed as much as the transmission unit I region by irradiating the beams on the substrate 107 positioned on a lower part of the beam blocking unit 112 through the transmission unit I formed on the beam blocking unit 112.

As described above, when the pattern formation is completed on one part of the substrate 107 by using the beam blocking unit 112, a pattern is formed by the same method on another new part of the substrate 107 on which the pattern is not formed by vertically and horizontally transferring the substrate 107 as much as the beam transmission region of the beam blocking unit 112.

Therefore, as shown in FIG. 1, the substrate 107 is mounted on the substrate transfer device 108 to be transferred vertically and horizontally and the patterns can be substantially formed on the entire surface of the substrate 107 by movement of the substrate transfer device 108.

FIG. 4 is a view showing regions on which the patterns are formed by vertically and horizontally transferring the substrate 107 as much as the beam transmission region of the beam blocking unit 112. When the initial beam transmission region is referred to as an "A" section, patterns can be formed on a "B" section and a "C" section in the same area as the "A" by horizontally transferring the substrate 107 through the substrate transfer device 108 and a pattern can be formed on a "D" section under the "A" section in the same area as the "A" section by vertically transferring the substrate 107. And, when the pattern is formed on the "D", the same pattern can be formed on an "E" section and an "F" section by horizontally transferring the substrate 107.

Herein, all the "A" to "F" sections correspond to the transmission unit I region of the beam blocking unit 112, wherein they have the same area and the fine patterns can be formed over the entire surface of the substrate 107 by vertically and horizontally transferring the substrate 107 as much as the transmission unit I region.

At this time, the formed patterns are uniform by each of the sections in the substrate and therefore the continuity between sections is not maintained but there is hardly difference in terms of performance when practically being applied in comparison with patterns wholly maintaining the continuity because types and periods of the patterns are the same. That is, as shown in FIG. 2, because the intensity of the beams irradiated on the substrate through the transmission unit I is not the same as a specific value and it is reduced as getting away from a central axis, there is difference in the intensity of the beams between the central part and a peripheral part of the transmission unit I. Accordingly, because the pattern formed in the one section of the substrate is not entirely uniform in the central part and the peripheral part, the continuity between the sections is not maintained, but the types and periods of the patterns formed in each of the sections are the same and therefore there is hardly difference in the performance in comparison with the patterns wholly maintaining the continuity.

As described above, in accordance with the present invention, it is possible to reduce a cost for constructing the system by remarkably reducing a cost for constructing the substrate transfer device in comparison with the conventional beam scanning method because the substrate is transferred after forming the pattern on the predetermined section and it is not required to maintain the continuity between the formed pattern sections.

As described above, in accordance with the present invention, the apparatus for forming the nano pattern is capable of improving the uniformity of the patterns by enhancing the uniformity of the intensity of the beams contributing to forming the pattern by transmitting only the central part where the intensity of the expanded beam is the highest through the beam expansion unit and the beam blocking unit.

Further, the present invention has an advantage of forming the uniform pattern over the entire surface of the substrate in a short time in comparison with the conventional beam scanning method by dividing the pattern forming region into the several small sections (that is, one section corresponds to the transmission unit region of the beam blocking unit) and sequentially forming the patterns on each of the sections by transferring the substrate as much as the each of the sections.

As described above, in accordance with the present invention, to take only the advantages of the conventional beam expansion method and the beam scanning method, the patterns are sequentially formed by including the beam expansion unit and the beam blocking unit and transferring the substrate as much as the beam transmission region of the beam blocking unit and therefore only if the beam expansion unit, the beam blocking unit and the substrate transfer device for transferring the substrate are provided, any kinds of holographic lithography systems may be included.

And, in accordance with the present invention to take only the advantages of the beam expansion method and the beam scanning method, the apparatus for forming the nano pattern and the method for forming the nano pattern using the same are capable of fabricating the fine patterns with the uniformity by each of the sections on the overall substrate at a low cost in a short time by including the beam expansion unit and the beam blocking unit to block only the beams of regions apart from the central part of the expanded beams through the beam expansion unit at the predetermined distance.

As described above, although the preferable embodiment of the present invention has been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. An apparatus for forming a nano pattern comprising:
   a laser to generate a beam;
   a beam splitter to split the beam from the laser into two beams having the same intensity;
   variable mirrors to reflect the two beams split by the beam splitter to a substrate;
   beam expansion units to expand the diameters of the two beams, respectively positioned on paths of the two beams traveling toward the substrate;
   a beam blocking unit, installed on an upper part of the substrate, to transmit only a specific region of the expanded beam through the beam expansion unit and to block a remaining region to form a uniform pattern; and
   a substrate transfer device to transfer the substrate vertically and horizontally, to allow the entire surface of the substrate to be irradiated, installed on a lower part of the substrate,
   wherein the beam blocking unit only transmits a central part of the expanded beams, the central part of the beams having maximum intensity,
   wherein the substrate transfer device transfers substrate sequentially by an equal amount to each section of the uniform pattern, and
   the central parts of the beams are limited to being greater than half of the maximum intensity thereof.

2. The apparatus for forming the nano pattern according to claim 1, further comprising reflection mirrors to change a path of the beam generated by the laser disposed between the laser and the beam splitter.

3. A method for forming a nano pattern comprising:
   generating a beam through a laser;
   splitting the beam into two beams having the same intensity through a beam splitter;
   directing the two beams to a substrate through variable mirrors;
   expanding diameters of the beams through beam expansion units respectively positioned on paths of the two beams traveling toward the substrate;
   illuminating the substrate by transmitting only a central part of the expanded beams through a beam blocking unit installed on an upper part of the substrate;
   irradiating the beams over the entire surface of the substrate to form a uniform pattern by a movement of a substrate transfer device having the substrate mounted thereon and installed on a lower part of the substrate, the substrate transfer device being moved vertically and horizontally by amounts equal to each section of the uniform pattern, the central part of the beams having a maximum intensity; and
   irradiating the beams sequentially forming the uniform patterns on the substrate by transferring the substrate as much as each uniform pattern,
   wherein the central parts of the beams are limited to being greater than half of the maximum intensity thereof.

4. The method according to claim 3, further comprising coating the substrate with UV curable resin.

5. The method according to claim 3, further comprising:
   changing a path of the beam generated from the laser through at least one reflection mirror.

* * * * *